(12) United States Patent
Weekamp

(10) Patent No.: US 7,918,702 B2
(45) Date of Patent: Apr. 5, 2011

(54) LARGE AREA LED ARRAY AND METHOD FOR ITS MANUFACTURE

(75) Inventor: Johannes Wilhelmus Weekamp, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 269 days.

(21) Appl. No.: 12/298,062

(22) PCT Filed: Apr. 11, 2007

(86) PCT No.: PCT/IB2007/051295
§ 371 (c)(1),
(2), (4) Date: Oct. 22, 2008

(87) PCT Pub. No.: WO2007/122534
PCT Pub. Date: Nov. 1, 2007

(65) Prior Publication Data
US 2009/0184617 A1    Jul. 23, 2009

(30) Foreign Application Priority Data
Apr. 25, 2006   (EP) .................................... 06113035

(51) Int. Cl.
*H01J 9/00* (2006.01)
(52) U.S. Cl. ........................................................ 445/23
(58) Field of Classification Search ........ 313/1; 445/23, 445/24, 25; 362/249.02–249.06, 230, 231, 362/800, 253; 29/825, 835, 846, 853, 872, 29/873, 886
See application file for complete search history.

(56) References Cited

U.S. PATENT DOCUMENTS

| 6,617,617 | B2 | 9/2003 | Takekuma et al. |
| 6,710,373 | B2 | 3/2004 | Wang |
| 2003/0223236 | A1 | 12/2003 | Wu |
| 2004/0037080 | A1* | 2/2004 | Luk et al. .................... 362/252 |
| 2005/0057939 | A1 | 3/2005 | Mizuyoshi |
| 2005/0062123 | A1 | 3/2005 | Weigert |
| 2007/0068055 | A1* | 3/2007 | Segan et al. .................... 40/544 |

FOREIGN PATENT DOCUMENTS
JP    2000089700 A    3/2000

* cited by examiner

*Primary Examiner* — Joseph L Williams
*Assistant Examiner* — Andrew J Coughlin

(57) ABSTRACT

A method for manufacturing a large area LED array, comprising providing two stacks (21) of electrodes (26), each electrode arranged in a meander pattern (4) on a substrate (3), at least two U-turns (7) on one side of the meander each being connected to a LED mounting surface (8) to form a row (9) of mounting surfaces, arranging the stacks so that rows and columns of mounting surfaces intersect each other at a plurality of intersection points (24), and mounting LEDs (22) at these intersection points. The substrate material is then removed, and the stacks are stretched in two directions thereby separating said intersection points (24) from each other. According to the invention, the LEDs can be mounted to the LED mounting surfaces when these are still located close to each other, preferably adjacent to each other enabling a simple and cost efficient mounting process. Further, the size of the substrates on which the conducting layer is formed can be limited. This further increases the cost effectiveness of the process.

6 Claims, 7 Drawing Sheets

LARGE AREA LED ARRAY AND METHOD FOR ITS MANUFACTURE

The present invention relates to a large area LED array, i.e. an arrangement of LEDs on a structure providing connection of the LEDs with suitable drive circuitry.

Such structure typically has the form of a grid, comprising row electrodes and column electrodes, on which the LEDs are mounted in intersections between these electrodes. When the LED array has a large area, the grid pattern has relatively large distances between the intersection in which the individual LEDs are mounted. This leads to a complex and expensive process for mounting the LEDs.

It is an object of the present invention to overcome this problem, and to provide cost efficient mounting of LEDs to form a large area LED array.

This and other objects are achieved by a method for manufacturing a large area LED array, a sheet element for use in this method, a LED assembly, and a large area LED array.

A first aspect of the present inventive concept relates to claim 1.

A second aspect of the inventive concept relates to a sheet element suitable for use in a method according to the first aspect, comprising a substrate and a conducting layer formed on the substrate in a meander pattern, where at least two U-turns on one side of the meander each is connected to a LED mounting surface to form a row of mounting surfaces.

A third aspect of the inventive concept relates to an assembly comprising two stacks of elements according to the second aspect. The stacks are arranged so that rows of mounting surfaces of each stack intersect each other at a plurality of intersection points, and LEDs are mounted at said intersection points.

According to the first aspect, the LEDs can be mounted to the LED mounting surfaces when these are still located close to each other, preferably adjacent to each other. Further, the LEDs are mounted when the electrodes are still supported by the substrates, thus providing useful support for the mounting process. This enables a simple and cost efficient mounting process.

The substrate material can then be removed, and the combined stack can be stretched in two different directions, thereby separating the mounting surfaces and the LEDs mounted thereon. The end result is a sparse grid, suitable for use in any application requiring LED illumination over a large area, e.g. backlighting for a large area LCD display.

An advantage is that the size of the substrates on which the conducting layer is formed is limited. This reduces the amount of substrate material required, and further increases the cost effectiveness of the process.

It is realized by the skilled person that the order of the steps need not be the one presented above. For example, it is possible, and possibly even preferred, that the LEDs are mounted on the first stack of electrodes before the second stack is arranged in its position.

The stretching is preferably performed during deformation of bending regions connecting each mounting surface with straight legs of the meander. This prevents the stretching process from causing deformation of the mounting surfaces. Such deformation could impair the electrical connections of the LEDs. By isolating the deformation caused by the stretching to regions intended for such deformation, the stretched grid will also present improved structural strength.

The substrate material can be a metal, preferably aluminum. The substrate material can be removed by wet etching. This technique provides a suitable way to remove substrate material surrounding the stacked meander patterned electrodes.

According to one embodiment, the conducting layer is provided with two holes on opposite sides of the meander pattern. The stretching can then be performed by arranging a first pair of parallel support rods through holes in each row electrode, the holes being arranged on opposite ends of said meander pattern, arranging a second pair of parallel support rods through holes in each column electrode, the holes being arranged on opposite ends of said meander pattern, and separating the support rods in each pair from each other. When the combined stack is stretched in one direction, using one of the support rod pairs, the other support rods will act like guides, avoiding non-uniform application of stress and tension on the stacks.

Preferably, each meander pattern and the mounting surfaces connected to this meander pattern are arranged in non-parallel, preferably perpendicular, planes. This can be accomplished with a substrate having the form of a bent sheet with a first and a second non-parallel, preferably perpendicular, surfaces, wherein the meander pattern is formed on the aid first surface, and the mounting surfaces connected to this meander pattern are formed on the second surface.

By arranging the meander and the mounting surfaces in non-parallel planes the orientation of the mounting surfaces can be better adapted for mounting the LEDs. Preferably, the meander and the mounting surfaces are in perpendicular planes, so that the stretching, which is performed in the plane of the meanders, will be parallel to the plane in which the LEDs are mounted.

This and other aspects of the present invention will now be described in more detail, with reference to the appended drawings showing a currently preferred embodiment of the invention.

Figure 1:
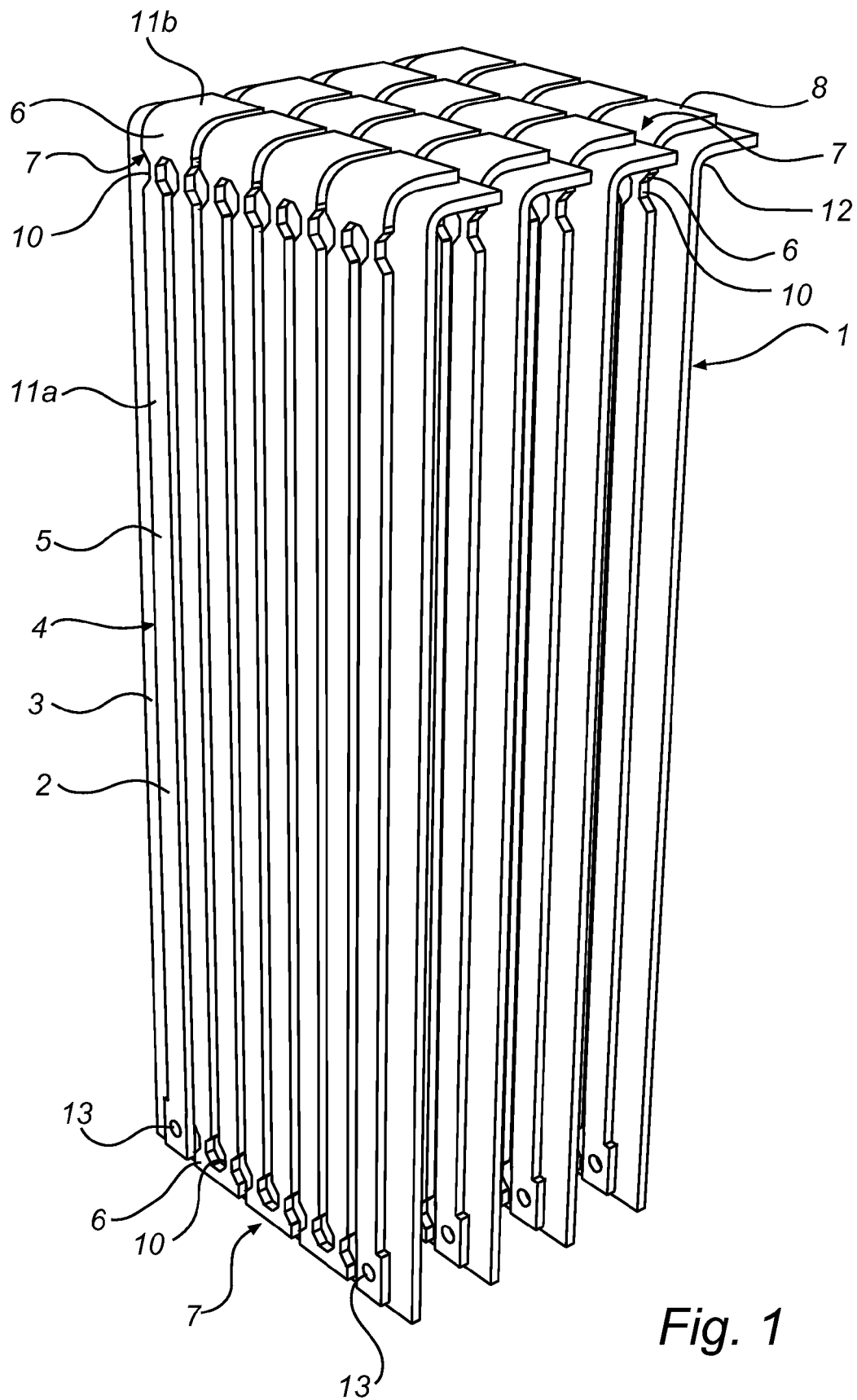
FIG. 1 is a perspective view of a sheet element according to an embodiment of the invention.

FIG. 1 shows a sheet element 1 comprising a conducting layer 2 arranged on a substrate 3. The conducting layer 1 forms an electrode, comprising a meander pattern 4 having a plurality of parallel straight legs 5, joined by connecting portions 6 to form U-turns 7, and a plurality of mounting surfaces 8 connected to the U-turns 7 on one side of the meander 4 to form a row 9 of mounting surfaces 8. Each leg 5 has a bending region 10 adjacent to each connecting portion 6, adapted to be deformable when exposed to stress. In the illustrated example, the bending regions 10 are formed by tampered areas in each end of each leg.

The conducting layer 2 is formed by material suitable for electrical conduction, e.g. copper or silver, and the substrate 3 can be of metal, e.g. aluminum, or any other material that can be removed during the manufacturing process, as will be described below. The conducting layer 2 can be deposited on the substrate in a conventional manner, and the described pattern 4 can be formed by etching or a similar process. As an example, the substrate thickness can be around 30 micrometers, and the conducting layer thickness can be around 30 micrometers.

In this embodiment, the substrate is bent along one side, to form two non-parallel surfaces 11a, 11b, so that the meander pattern 4 is arranged on one of these surfaces 11a, and the mounting surfaces 8 are arranged on the other surface 11b. Here, the bend 12 is approximately 90 degrees, so that the mounting surfaces are normal to the meander patterns. The substrate is preferably bent after the conducting layer has been deposited thereon, but it is also possible to deposit the conducting layer on a bent substrate.

Further, in this embodiment, each conducting pattern 4 is formed with holes 13 on opposite sides, preferably, as shown, in the outermost legs on each side of the meander.

Figure 2:
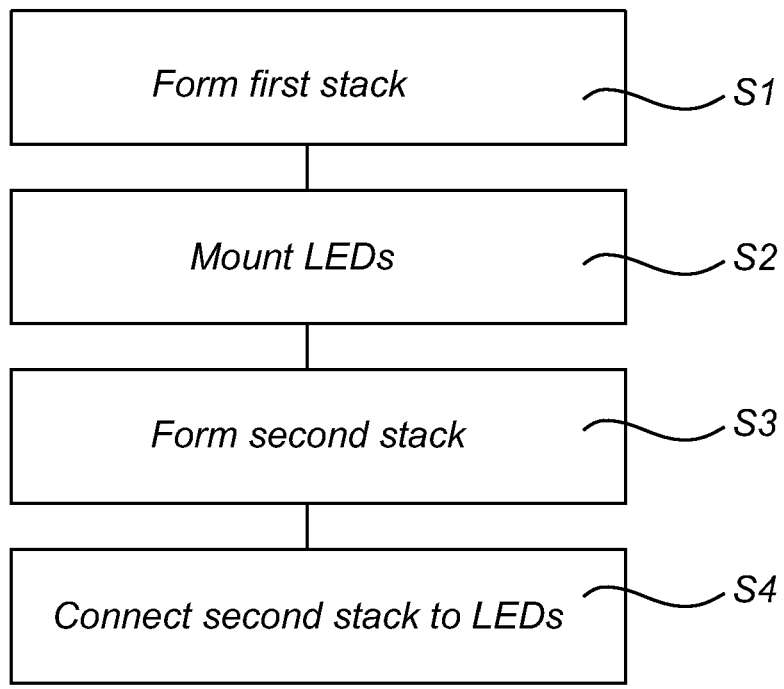
FIG. 2 is a flowchart of a method for assembling a plurality of sheet elements and LEDs to form a combined stack according to an embodiment of the invention.

FIG. 2 shows a flow chart of a method for making an assembly of sheet elements. First, in step S1, a first stack 21 of elements is formed, wherein the elements are arranged with their mounting surfaces 8a facing the same side of the stack. Then, in step S2, LEDs 22 are mounted on these mounting surfaces, each LED having one of their terminals in electrical contact with the corresponding mounting surface. In step S3, a second stack 23 of elements, similar to the first stack, is formed, and arranged with its mounting surfaces 8b facing the LEDs 22. The second stack is rotated 90 degrees in relation to the other, so that mounting surfaces 8a, 8b form rows and columns intersecting each other at a plurality of intersection points 24. In step S4, the LEDs are connected to the mounting surfaces 8b of the second stack 23, so that a LED is mounted in each intersection point 24, with one terminal connected to a mounting surface 8a of an element in the first stack 21, and another terminal connected to a mounting surface 8b of an element in the second stack 23. Such a combined stack 25 is shown in FIG. 3a.

It should be noted that the fact that the elements are bent so that the mounting surfaces are normal to the extension of the meander patterns, the opposing mounting surfaces will lie in parallel planes. This is advantageous for the mounting process.

Figure 4:
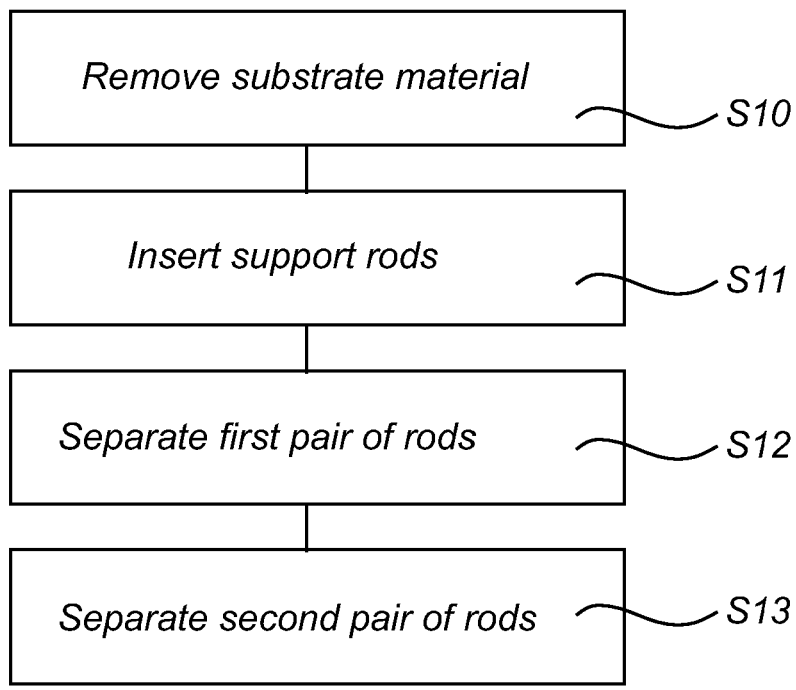
FIG. 4 is a flowchart of further processing of the combined stack in FIG. 3, to form a large are LED array according to an embodiment of the invention.
Figure 3A:
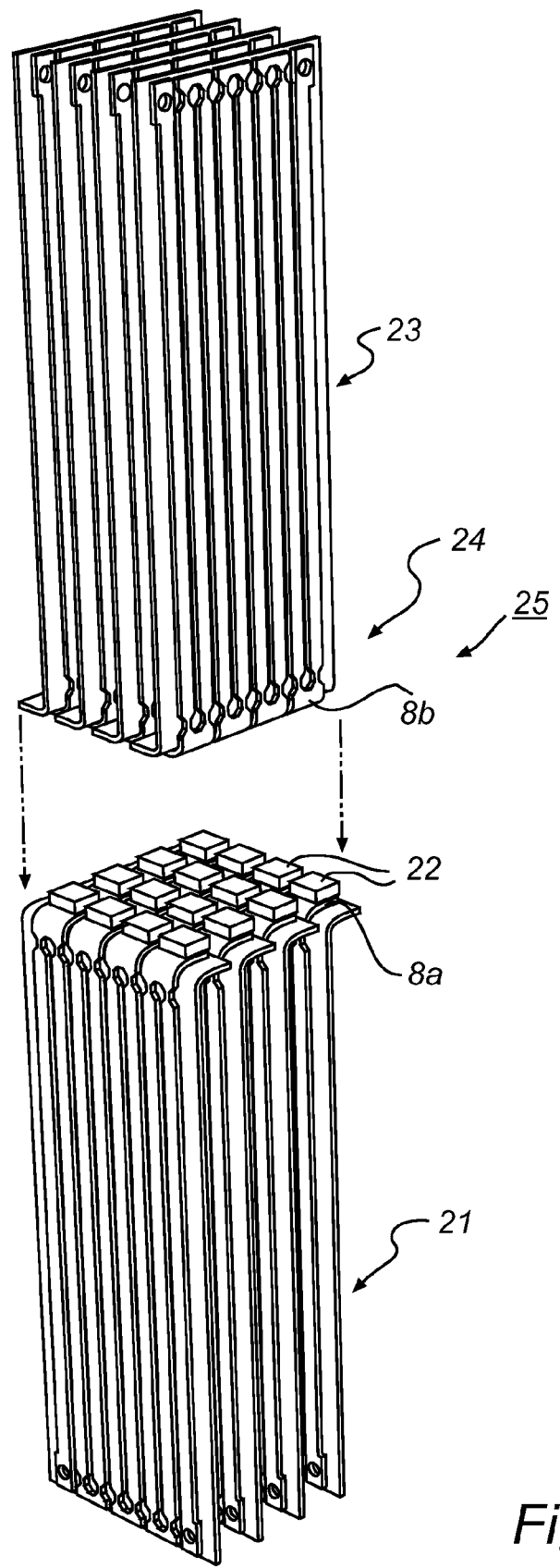
FIG. 3a is an exploded view of a combined stack assembled according to the method shown in FIG. 2, before the substrate material has been removed.

FIG. 4 shows a flow chart of further processing of the combined stack in FIG. 3a for manufacture of a large area LED array according to an embodiment of the invention.

Figure 3B:
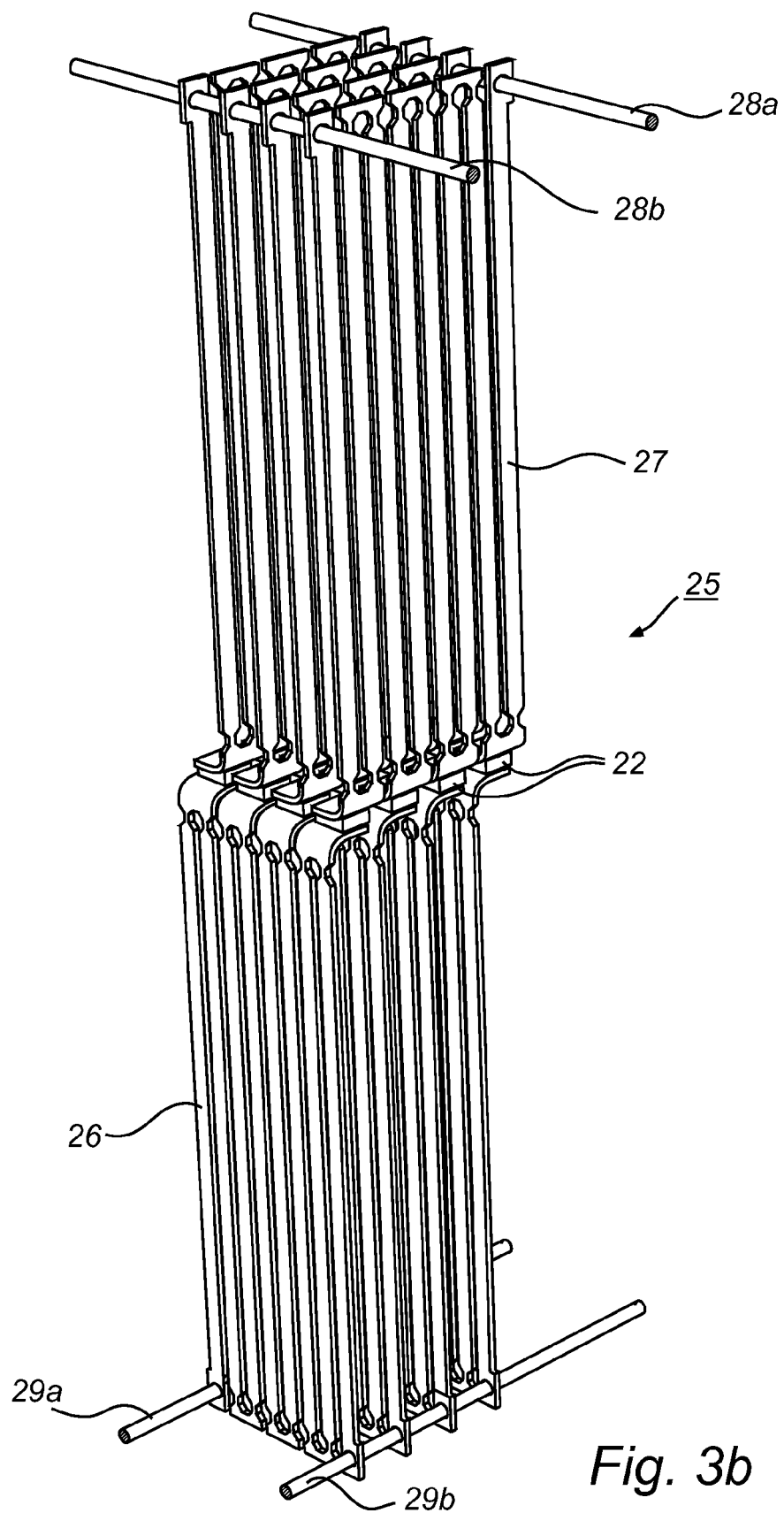
FIG. 3b is a perspective view of the combined stack in FIG. 3a, after the substrate material has been removed.

First, in step S10, the substrate material 3 is removed, e.g. by wet etching if the material is e.g. aluminum. The etching can be done in a NaOH solution in water at room temperature or elevated temperature in order to increase the speed. Other methods of substrate removal are possible. When the substrate material is removed, only the conducting layers 2 remain, forming row and column electrodes 26, 27 connecting the LEDs 22. Such a combined stack, without substrate material, is shown in FIG. 3b.

Figure 5A:
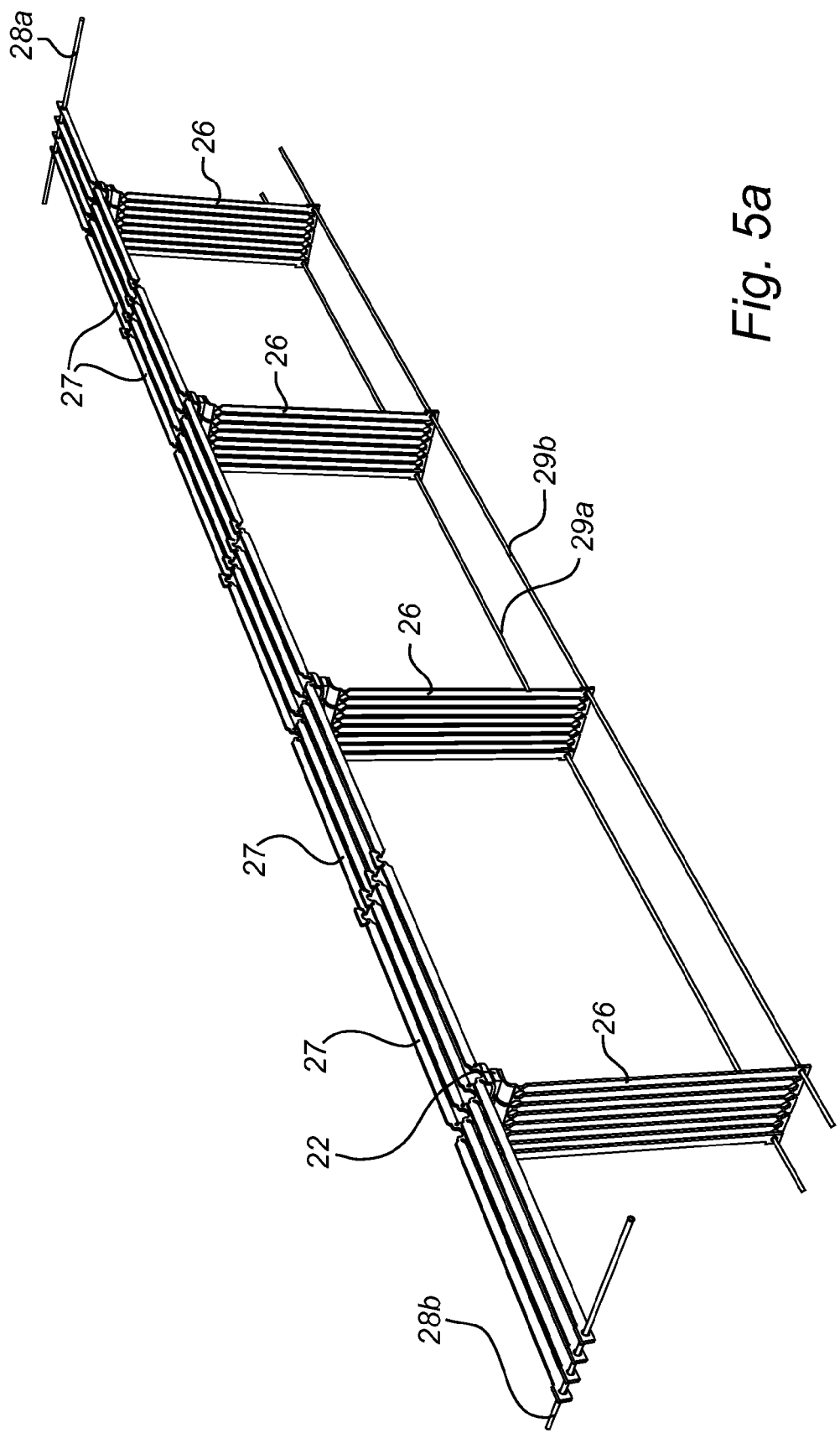
FIGS. 5a, 5b and 5c illustrate how the stack in FIG. 3 is stretched in two dimensions according to an embodiment of the invention.

In step S11, two pairs of parallel support rods 28a, 28b, 29a, 29b are inserted in the holes 13 in the electrodes 26, 27. In step S12, the rods 28a, 28b in one pair are separated, thereby stretching the electrodes 27 in this stack 23 in a direction parallel to the planar extension of these electrodes. The result of this stretching is illustrated in FIG. 5a.

In step S13, the rods 29a, 29b in the other pair are separated, thereby stretching the electrodes 26 in the other stack 21 in a perpendicular direction. The result of this stretching is illustrated in FIG. 5b.

Figure 5B:
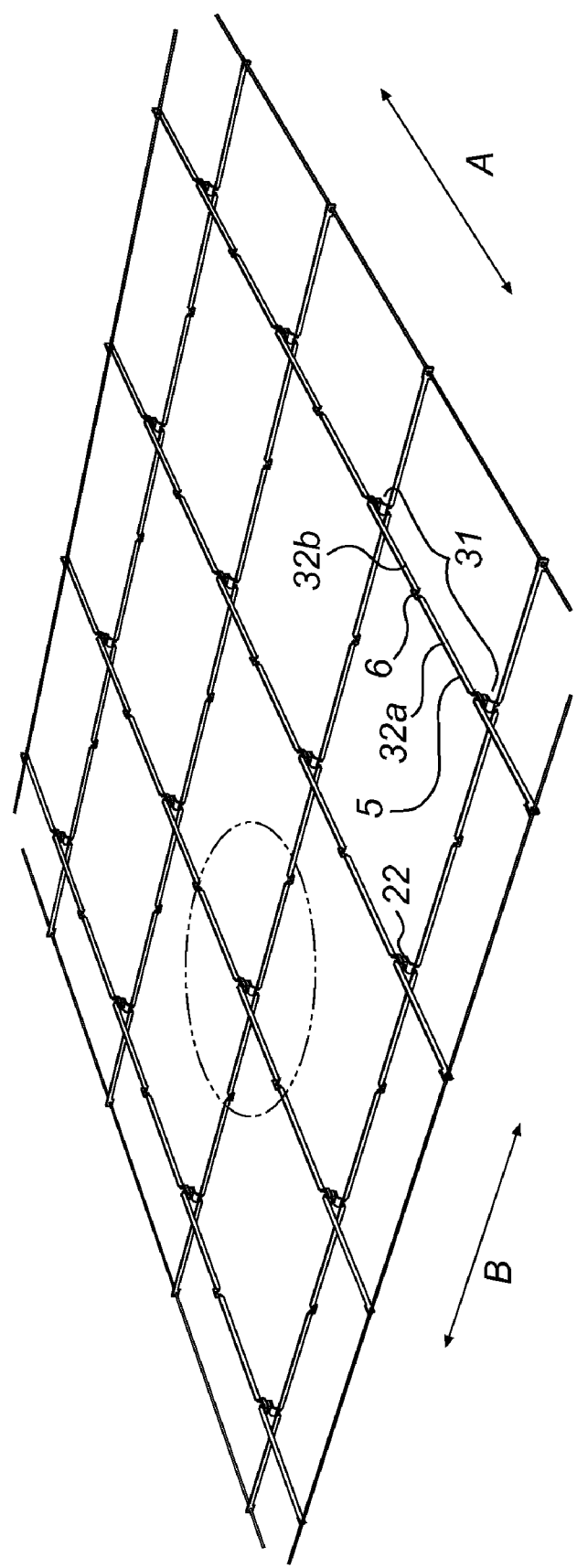

As shown in FIG. 5b, the stretching separates the LEDs 22 from each other in two directions A, B, while the legs 5 of the meander patterns of the electrodes 26, 27 are unfolded to form essentially straight sections 31 extending between respective LEDs 22. Each such section will thus comprise two strips 32a, 32b extending in a plane normal to the dominating planar extension of the LED array, which strips are joined by a connecting portion 6. The deformation of the meander is primarily limited to the bending regions 10 connecting each leg 5 to the connecting portion 6 (see FIG. 1). Further, the mounting surfaces 8 are affected very little by the deformation, as they are arranged in a plane non-parallel to the extension of the legs 5.

Figure 5C:
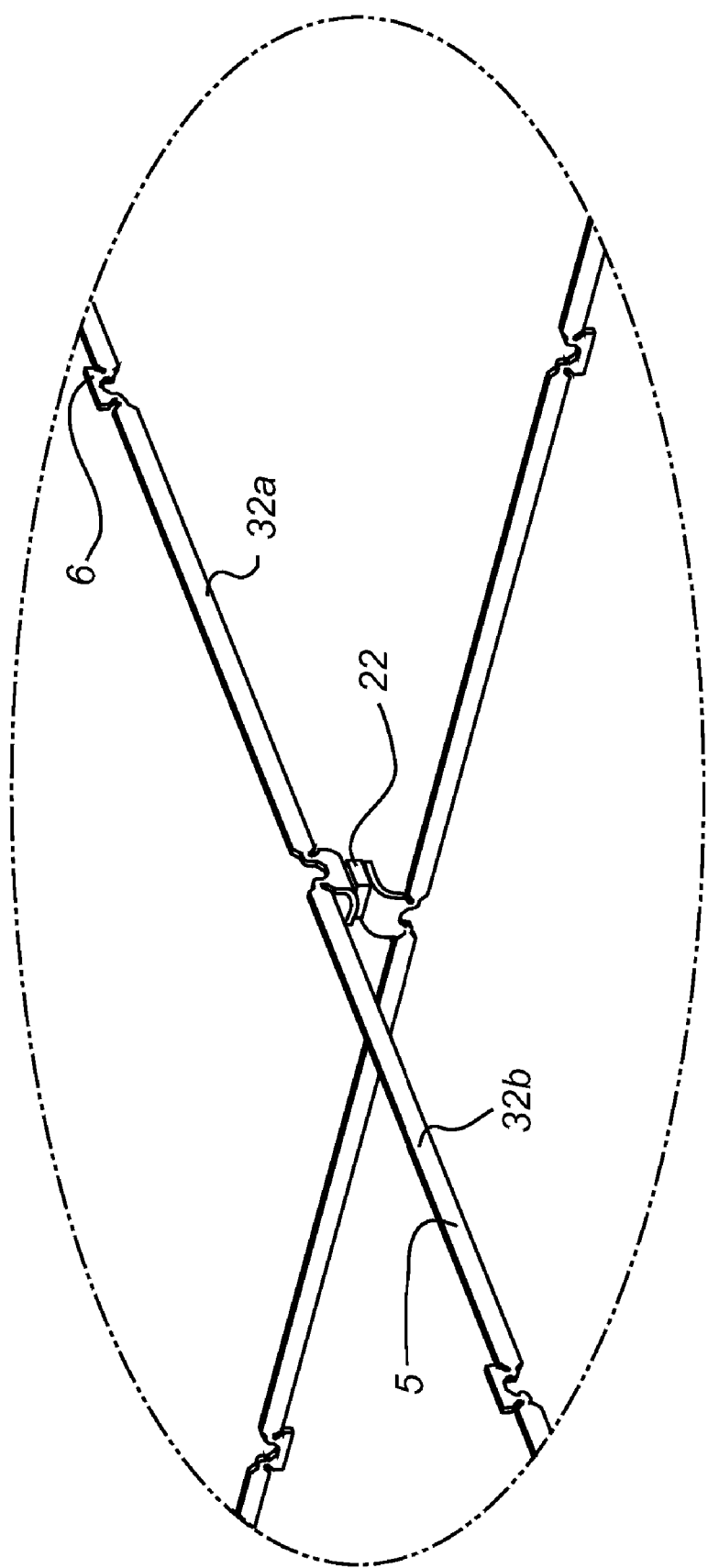

FIG. 5c shows an intersection point 24 and its surroundings in greater detail.

According to one embodiment, a LED array manufactured according to this method comprises 750 LEDs, distributed over an area 100 cm by 30 cm, resulting in a LED pitch of around 2 cm. Such a LED array is suitable for use in a LED based luminaire. Other applications include LCD backlights.

The person skilled in the art realizes that the present invention by no means is limited to the preferred embodiments described above. On the contrary, many modifications and variations are possible within the scope of the appended claims. For example, the shape and form of the meander pattern can be varied. Also, the form and location of the bending regions can be varied.

Further, the mounting surfaces do not need to be arranged in planes normal to the planes of the meanders. If they lie in the same plane as the meanders, they will be form a straight angle with respect to each other, something that will have to be considered when mounting the LEDs.

The invention claimed is:

1. A method for manufacturing a large area LED array, comprising:
    providing a stack of row electrodes, each row electrode arranged in a meander pattern on a substrate, at least two U-turns on one side of the meander each being connected to a LED mounting surface to form a row of mounting surfaces,
    providing a stack of column electrodes, each column electrode arranged in a meander pattern on a substrate, at least two U-turns on one side of the meander each being connected to a LED mounting surface to form a column of mounting surfaces,
    arranging said stacks of row and column electrodes so that rows and columns of mounting surfaces intersect each other at a plurality of intersection points,
    mounting LEDs at said intersection points, so that a first terminal of each LED is connected to a mounting surface of a row electrode, while a second terminal of each LED is connected to a mounting surface of a column electrode,
    removing substrate material surrounding each electrode,
    stretching said stack of row electrodes in a direction parallel to the rows of mounting surfaces,
    stretching said stack of column electrodes in a direction parallel to the columns of mounting surfaces,
    thereby separating said intersection points from each other.

2. A method according to claim 1, wherein each meander pattern extends in a plane non-parallel, preferably perpendicular, to the mounting surfaces connected to this meander pattern.

3. A method according to claim 1, wherein said substrate has the form of a bent sheet, said sheet having a first and a second non-parallel, preferably perpendicular, surface, and wherein said meander pattern is formed on said first surface, and the mounting surfaces connected to this meander pattern are formed on said second surface.

4. A method according to claim 1, wherein said stretching is performed during deformation of bending regions connecting each mounting surface with straight legs of the meander.

5. A method according to claim 1, wherein the substrate material is removed by wet etching.

6. A method according to claim 1, wherein stretching of the stacks is performed by:

arranging a first pair of parallel support rods through holes in each row electrode, said holes being arranged on opposite ends of said meander pattern, arranging a second pair of parallel support rods through holes in each column electrode, said holes being arranged on opposite ends of said meander pattern, and separating the support rods in each pair from each other.

* * * * *